United States Patent [19]

Shinar et al.

[11] Patent Number: 5,334,539
[45] Date of Patent: Aug. 2, 1994

[54] FABRICATION OF POLY(P-PHENYLENEACETYLENE) LIGHT-EMITTING DIODES

[75] Inventors: Joseph Shinar; Leland S. Swanson; Feng Lu; Yiwei Ding, all of Ames, Iowa

[73] Assignee: Iowa State University Research Foundation, Inc., Ames, Iowa

[21] Appl. No.: 11,391

[22] Filed: Jan. 29, 1993

[51] Int. Cl.$^5$ ............... H01L 21/00; H01L 21/02; H01L 29/28
[52] U.S. Cl. .................................. 437/1; 437/225; 437/228
[58] Field of Search ........................... 437/1, 225, 228

[56] References Cited

U.S. PATENT DOCUMENTS

| | | | |
|---|---|---|---|
| 4,507,672 | 3/1985 | Potember et al. | 437/1 |
| 5,213,983 | 5/1993 | Gustafsson et al. | 437/1 |
| 5,247,190 | 9/1993 | Friend et al. | 257/40 |

FOREIGN PATENT DOCUMENTS

| | | | |
|---|---|---|---|
| 443861A2 | 8/1991 | European Pat. Off. | |
| 0095979 | 5/1985 | Japan | 437/1 |
| 0281770 | 11/1990 | Japan | 437/1 |
| 0281771 | 11/1990 | Japan | 437/1 |
| 90/13148 | 11/1990 | PCT Int'l Appl. | |

OTHER PUBLICATIONS

D. Bloor, Nature, 356, 19–20 (Mar. 1992).
D. Braun et al., Appl. Phys. Lett., 58, 1982–1984 (May 1991).
D. Braun et al., "Transient Electroluminescence from Polymer Light Emitting Diodes" presented at the International Conference on Science and Technology of Synthetic Metals, Goteborg, Sweden, Aug. 1992.
A. R. Brown et al., Appl. Phys. Lett., 61, 2793–2795 (Dec. 1992).
A. R. Brown et al., "Optical Probes of Electronic States Injected into Poly(P-Phenylenevinylene) Electroluminescent Devices" presented at the International Conference on Science & Technology of Synthetic Metals, Goteborg, Sweden, Aug. 1992.
P. L. Burn et al., Nature, 356, 47–49 (1992).
J. H. Burroughes et al., Nature, 347, 539–541 (Oct. 1990).
C&EN, "Science-Polymer lights up flat screen displays", p. 26 (Oct. 15, 1990).
G. Grem et al., Adv. Mater., 4, 36–37 (1992).
G. Gustafsson et al., Nature, 357, 477–479 (Jun. 1992).
S. Kajigaeshi et al., Chem. Lett., 2109–2112 (1987).
S. Kajigaeshi et al., Chem. Lett., 795–798 (1988).
M. E. Neubert et al., Mol Cryst. Liq. Cryst., 44, 197–210 (1978).
Y. Ohmori et al., Japanese J. Appl. Physics, 30, L1941–L1943 (1991) (abstract only).

(List continued on next page.)

Primary Examiner—Brian E. Hearn
Assistant Examiner—B. Everhart
Attorney, Agent, or Firm—Schwegman, Lundberg & Woessner

[57] ABSTRACT

Acetylene containing poly(p-phenyleneacetylene) (PPA) - based light-emitting diodes (LEDs) are provided. The LEDs are fabricated by coating a hole-injecting electrode, preferably an indium tin oxide (ITO) coated glass substrate, with a PPA polymer, such as a 2,5-dibutoxy or a 2,5-dihexoxy derivative of PPA, dissolved in an organic solvent. This is then followed by evaporating a layer of material capable of injecting electrons, such as Al or Al/Ca, onto the polymer to form a base electrode. This composition is then annealed to form efficient EL diodes.

20 Claims, 4 Drawing Sheets

OTHER PUBLICATIONS

K. Pichler et al., "Photoinduced Absorption of Structurally Improved Poly(P-Phenylene Vinylene)-No Evidence for Bipolarons" presented at the International Conference on Science and Technology of Synthetic Metals, Goteborg, Sweden, Aug. 1992.

J. Shinar et al.; Abstract of "Optically Detected Magnetic Resonance Studies of-Conjugated Polymer--Based Light Emitting Diodes" presented at SPIE-/IS&T Symposium on Electronic Imaging: Science and Technology; San Jose, Calif.; Jan. 31–Feb. 4, 1993; Paper #1910-18.

L. S. Swanson et al., "Photoluminescence, Electroluminescence, and Optically Detected Magnetic Resonance Study of 2,5-Dialkoxy Derivatives of Poly(P-Phenyleneacetylene) (PPA) and PPA-Based Light-Emitting Diodes" presented at the International Conference on Science and Technology of Synthetic Metals, Goteborg, Sweden, Aug. 1992.

L. S. Swanson et al.; Abstract of "Poly(P--Phenyleneacetylene)-Based Light Emitting Diodes" presented at SPIE/IS&T Symposium on Electronic Imaging: Science and Technology; San Jose, Calif.; Jan. 31–Feb. 4, 1993; Paper #1910-13.

FABRICATION OF POLY(P-PHENYLENEACETYLENE) LIGHT-EMITTING DIODES

STATEMENT OF GOVERNMENT RIGHTS

The present invention was made with the support of Ames Labs-U.S. Department of Energy under Contract No. W-7405-Eng-82 operated by Iowa State University. The Government has certain rights to this invention.

FIELD OF THE INVENTION

The present invention is directed to polymer-based light-emitting diodes (LEDs). More specifically, the present invention is directed to the fabrication of novel poly(p-phenyleneacetylene) (PPA) - based LEDs.

BACKGROUND OF THE INVENTION

Light-emitting diodes (LEDs) are rectifying semiconductor devices that convert electrical energy into electromagnetic radiation. They are typically inorganic solid-state devices that emit radiation in the visible region to the near infrared, i.e., in a region of about 400–1300 nm. Generally, an inorganic solid-state LED consists of elements from Groups IIB, IIIA, IVA, and VA of the Periodic Table of the Elements (i.e., Groups 12–15). For example, a red light-emitting diode is made of a gallium arsenide (GaAs) semiconductor, which has a direct band gap. These, however, are not easily or economically used in large-area displays. This is because of the difficulty in scaling the fabrication to a large matrix of GaAs pixels, while using very tightly controlled conditions. Systems based on polycrystalline zinc sulfide (ZnS) have also been developed, although low efficiencies and poor reliability have prevented large-scale production.

Many semiconductor devices can be based on organic molecules as well. Because of the high photoluminescence quantum yields common in organic molecular semiconductors, light emission through charge injection under a high applied field (electroluminescence) is possible. Thus, light-emitting diodes can be fabricated from organic molecules. Typically, vacuum sublimation is used in the fabrication of such diodes. Although the efficiencies and selection of emission color are very good for organic-based LEDs, there are problems associated with the long-term stability of the sublimed organic film against recrystallization and other structural changes.

One way to improve the structural stability of these organic layers is to use macromolecular organic materials. Macromolecular organic compounds containing conjugated systems, such as conjugated polymers, are a good choice in that they can, in principle, provide good charge transport. The most recent interest surrounding $\pi$-conjugated polymer-based electroluminescence (EL) in organic semiconductors has been stimulated by the discovery that sublimed molecular films can show high quantum efficiencies of luminescence. Thus, it has been recognized that $\pi$-conjugated polymers can be used for their electroluminescent properties in organic semiconductors. For example, intensely photoluminescent (PL) $\pi$-conjugated polymers such as the poly(3-alkylthiophenes) (P3ATs), poly(p-phenylenes) (PPPs), and poly(p-phenylenevinylenes) (PPVs) can also electroluminesce, and thereby be incorporated into diodes.

The LEDs incorporating $\pi$-conjugated polymers typically sandwich the conjugated polymers directly between high and low work function metals or other conductors, which act as hole and electron-injecting contacts, respectively. As used herein, a "hole," i.e., an electron hole, is a vacant electron energy state, which behaves as though it were a positively charged particle. In these diodes, the injected positive and negative charges move through the conjugated polymer under the influence of an applied electric field. The charges either annihilate one another to form a triplet or a singlet exciton, of which only the singlet may decay radiatively, or they pass through the conjugated polymer layer to the electrode of opposite charge.

One of the first LEDs reported as incorporating conjugated polymers consisted of a rectifying metal contact of an emissive layer of poly(p-phenylenevinylene) (PPV) sandwiched between indium tin oxide (ITO), which acts as a hole-injecting electrode, and an electron-injecting layer of aluminum. See, for example, J. H. Burroughes et al., Nature, 347, 539 (1990), and A. R. Brown et al., Appl. Phys. Lett., 61, 2793 (1992). Another example of an LED that incorporates a conjugated diode is Ca/poly(2-methyl, 5-(2'-ethylhexoxy)-p-phenylenevinylene)/(doped polyaniline). See G. Gustafsson et al., Nature, 357, 477 (1992). In other diodes, the injected charge carriers are confined to the light-emitting layer by a polymeric electron-conducting-hole-blocking layer.

Although such conjugated polymer-based EL diodes appear to be very promising for the development of low-cost, multicolored, large-area active flat displays, there are a number of remaining impediments to commercialization that need to be corrected. For example, many organic polymer-containing diodes have low EL efficiencies, have deficient color-control capabilities, are unstable in air, and/or have very short operating lifetimes, i.e., only about a few minutes to a few days.

For example, the photon/(injected electron) yield of the Al/PPV/ITO LED, discussed above, is only about $10^{-4}$. Furthermore, it is unstable in air. That is, it degrades both through a catastrophic short and steady decline in the emission at constant current. Replacing the aluminum with calcium, a lower work-function element, however, causes a dramatic improvement in the efficiency of the LED, enhancing the photon/(injected electron) yield of the LED to about 1%, which is comparable to the yield of commercial GaAs-based LEDs. This Ca/PPV/ITO LED is very unstable for reasons not entirely clear, but may include diffusion of the Ca metal through the polymer layer or oxidation of the Ca. Although the Ca/poly(2-methyl, 5-(2'-ethylhexoxy)-p-phenylenevinylene)/polyaniline LED, discussed above, is more stable, it still typically degrades continuously after a few hours. Furthermore, it fails catastrophically after degrading for a few days, and its emission is limited to the red-orange band of the visible spectrum.

The foremost obstacle towards the development of commercial diodes is the instability and degradation of the LEDs. The nature of the degradation, however, is not clear.

SUMMARY OF THE INVENTION

The present invention provides significant improvements to the aforesaid problems by use of poly(p-phenylenacetylene) (PPA) as the electroluminescent polymer in light emitting diodes. That is, the diodes of the present invention include a PPA polymer as the emissive layer. The light-emitting diode of the present invention includes an electroluminescent acetylene-based polymer layer, having first and second surfaces; a base electrode layer adjacent to the first surface of the electroluminescent acetylene-based polymer layer; a second electrode adjacent to the second surface of the electroluminescent acetylene-based polymer layer; and means for providing an electrical connection between the base electrode layer and the second electrode to complete a circuit.

The electroluminescent acetylene-based polymer layer comprises a poly(p-phenyleneacetylene) polymer of the formula $-[-C\equiv C-Ar-C\equiv C-Ar-]_n-$, having a number average molecular weight of at least about 2,000, wherein Ar is an arylene group, preferably a substituted arylene group, and $n \geq 5$. By "substituted" arylene (or phenylene), it is meant that the arylene group(s) in the main polymer chain contains at least one pendant functional group that does not interfere with the formation of the linear polymers. The term "arylene" refers to an aromatic moiety such as phenylene, biphenylene, naphthylene, thiophenylene, and the like, which contains further pendant groups as noted above. Preferably, arylene is ($C_6$–$C_{24}$)arylene, e.g., phenylene, a fused ring system such as naphthylene, a multiple ring system such as biphenylene, or is a hetero-aromatic system, such as a thiophenylene or pyridenylene group. More preferably, the arylene is a ($C_6$–$C_{24}$)arylene substituted with at least one functional group, e.g., such as an alkyloxy group.

In certain preferred embodiments, the base electrode layer is a layer of aluminum that is evaporated onto the poly(p-phenyleneacetylene) polymer. The second electrode is made of a material that is at least translucent, and preferably transparent, and is capable of injecting holes, i.e., positive charges. Preferably it is a layer of material bonded to a substrate. In certain preferred embodiments this hole-injecting electrode layer is a layer of indium-tin-oxide coated on glass.

The present invention also provides a method for producing a polymer-based light-emitting diode having an active, i.e., electroluminescent, conjugated polymer layer sandwiched between two electrode layers. This method involves the steps of: coating a hole-injecting electrode, preferably an indium-tin-oxide coated glass substrate, with a layer of a conjugated polymer, preferably a poly(p-phenyleneacetylene) polymer of the formula $-[-C\equiv C-Ar-C\equiv C-Ar-]_n-$ discussed above; evaporating a layer of an electron-injecting material onto the conjugated polymer layer to form an electron-injecting electrode. This composite structure of a hole-injecting electrode, a polymer layer, and an electron-injecting electrode form a polymer-based light-emitting diode. The method further includes a subsequent step of annealing this polymer-based light-emitting diode at a temperature and for a period of time effective to improve the operating lifetime of the diode as an efficient electroluminescent (EL) device. That is, annealing is carried out at a temperature and for a period of time to result in a reduction in the EL threshold voltage, i.e., the initial voltage at which the diode electroluminesces, by at least about 20%. Preferably, the annealing step occurs at a temperature of about 100°–250° C. for about 1–24 hours.

As used herein, the term "alkyl" means a saturated linear, branched, or cyclic hydrocarbon group. The term "alkenyl" means an unsaturated linear, branched, or cyclic hydrocarbon group, i.e., the monovalent residue remaining after removal of a hydrogen atom from a linear or branched chain hydrocarbon containing at least one carbon-carbon double bond. The term "aryl" or "arylene" means a mononuclear or polynuclear aromatic hydrocarbon or heteroaromatic group. That is, the term "arylene" refers to a monovalent residue remaining after removal of two hydrogen atoms from an aromatic compound (single ring and multi- or fused-ring). The term "polymeric" or "polymer" is used herein in its usual manner to mean a compound consisting essentially of repeating structural units. The term "linear" polymer means a polymer whose molecules are arranged in a chain-like fashion with few (or no) branches or bridges between the chains.

DETAILED DESCRIPTION OF THE INVENTION

The present invention relates to polymer-based light-emitting diodes (LEDs). The diodes are injection-type diodes in which an active, i.e., electroluminescent, acetylene-based polymer, i.e., ethynylene-based polymer, is sandwiched between two different conducting layers, i.e., electrodes, forming two nonohmic interfaces. One of the electrodes is a hole-injecting electrode, which is translucent, preferably transparent, and the other electrode is an electron-injecting electrode. These two electrodes are electrically connected to each other and to a source of current to create a complete circuit. Preferably, the light-emitting diode of the present invention includes an electroluminescent acetylene-based polymer layer, a base electron-injecting electrode layer, a hole-injecting electrode layer coated on a substrate, and connecting wires between the base electrode layer and the hole-injecting layer. The hole-injecting layer and the substrate on which it is coated are translucent, preferably transparent. That is, the materials from which the hole-injecting layer and the substrate are formed are translucent, preferably transparent.

Figure 1:
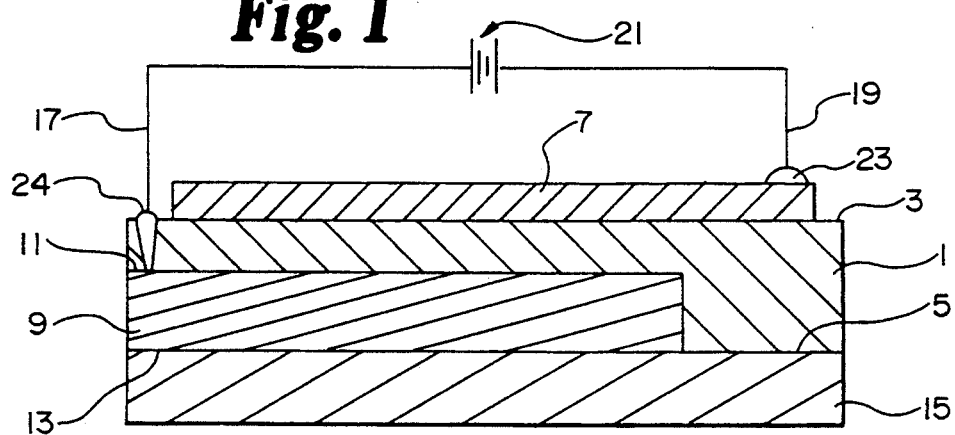
FIG. 1 is a schematic cross-sectional representation of a preferred LED of the present invention with a nonconducting substrate having coated thereon a layer of a hole-injecting material.

Referring to FIG. 1, a light emitting diode of the present invention includes an electroluminescent acetylene-based polymer layer (1), having first and second surfaces (3) and (5), respectively. Adjacent to the first surface (3) of the electroluminescent acetylene-based polymer layer (1) is a base electrode layer (7), i.e., an electron-injecting electrode layer. Adjacent to the second surface (5) of the electroluminescent acetylene-based polisher layer (1) is a second electrode layer (9), i.e., a hole-injecting electrode layer, having first and second surfaces (11) and (13). In this preferred embodiment, the second electrode layer (9) partially covers a substrate (15) on which it is coated. Typically, this is accomplished by etching away part of the hole-injecting layer from the substrate. The hole-injecting electrode layer (9) is translucent, preferably transparent. The substrate (15) is also translucent, preferably transparent, and is preferably made of a nonconductive material, such as glass. Two wires (17) and (19) connect the base electron-injecting electrode layer (7) and the hole-injecting electrode layer (9) through a DC power source (21) to form a complete circuit.

Each of wires (17) and (19) can be bonded to the electrode layers in any manner that allows effective electrical contact between the wires and the electrode layers. This connection, i.e., bond, can be created through the use of conductive paint, epoxy, solder, and the like. Preferably, this connection is made using silver paint as the bonding agent, i.e., contact material. Referring to FIG. 1, a droplet of contact material (23), e.g., silver paint, bonds wire (19) to the base electrode layer (7). A droplet of contact material (24), e.g., silver paint, bonds wire (17) to the hole-injecting electrode layer (9). The contact material (24) that bonds wire (17) is applied to a region of the hole-injecting electrode layer (9) by way of initially applying the silver paint to the electroluminescent polymer layer (1). The contact material (24) burrows through the polymer layer (1) to the hole-injecting electrode layer (9) to form a connection with wire (17). As can be seen in FIG. 1, the contact material (24) is thus connected to an exposed portion of the hole-injecting electrode layer (9).

As can be seen in FIG. 1, the droplet of contact material (23) that bonds wire (19) is applied to a region of the base electron-injecting electrode layer (7) that is directly above a portion of the substrate (15) where there is no hole-injecting electrode layer (9). This ensures that there will be no shorting between the two electrode layers (7) and (9).

The electroluminescent acetylene-based polymer layer is preferably about 300–5000 Å thick, and more preferably about 500–1500 Å thick. The base electron-injecting electrode layer is preferably about 300–5000 Å thick, and more preferably about 1500–3000 Å thick. The hole-injecting electrode layer is preferably about 200–2000 Å thick, and more preferably about 1000–1500 Å thick.

Figure 2:
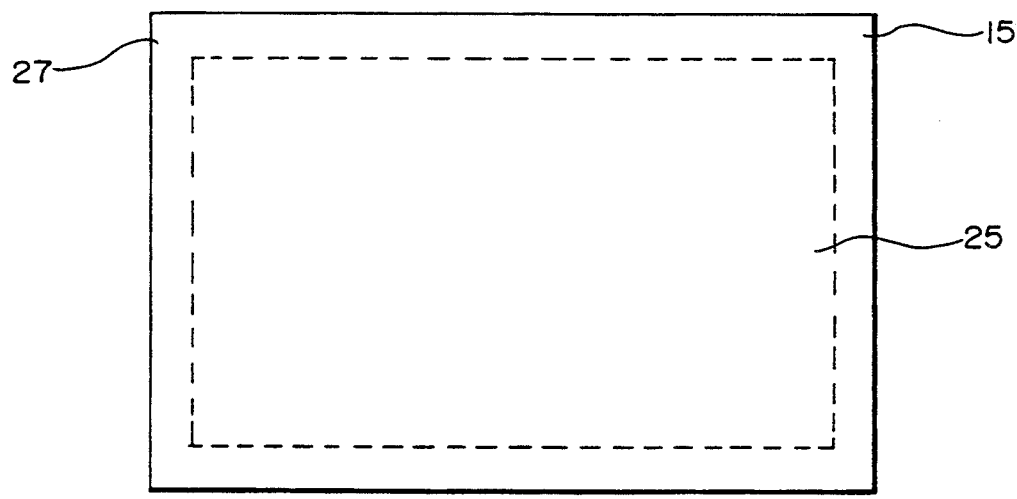
FIG. 2 is a schematic top view of the preferred LED of FIG. 1.

FIG. 2 shows the illumination area (25) as it shines through the substrate (15). This area is the same as the area of the electron-injecting electrode layer. This is because only the surface area of the electron-injecting electrode layer is the region in which the injected electrons can combine with the injected holes, and luminesce. FIG. 2 shows luminescence (25) on about 90% of the LED face surface area (27). In other embodiments, luminescence may range from about 30–90% of the LED face surface area, determined by the base electron-injecting electrode (7) size, and position on the electroluminescent acetylene-based polymer layer (1). The area of the base electron-injecting electrode layer (7) is governed by the need to allow for connection of wire (17), by way of contact material (23), bonding to the hole-injecting electrode layer (9). Exposure of electroluminescent acetylene-based polymer layer (1) is needed to allow for the contact material (24) to burrow its way through the electroluminescent acetylene-based polymer layer (1) to connect wire (17) and the hole-injecting electrode layer, i.e., the second electrode layer (9).

FIG. 1 shows a preferred embodiment of the present invention having the hole-injecting electrode layer (9) as indium-tin-oxide. This electrode layer is coated on a substrate (15), although it is understood that the hole-injecting electrode could be the substrate itself. That is, the diodes of the present invention also includes the embodiment shown in FIG. 3.

Figure 3:
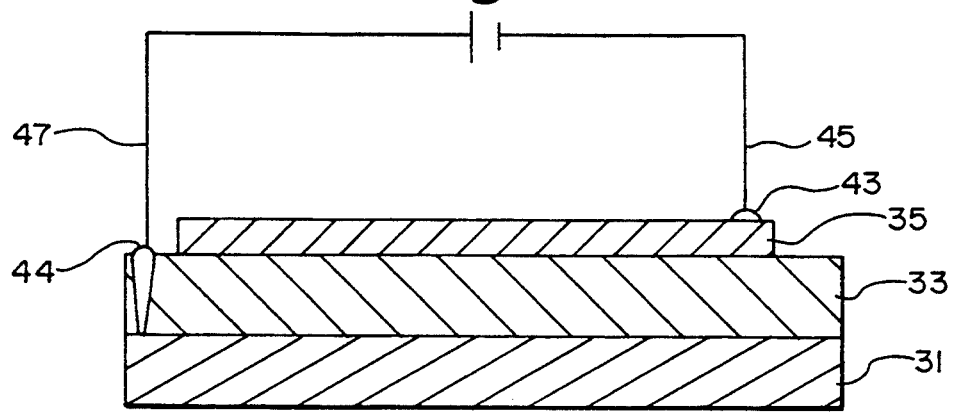
FIG. 3 is a schematic cross-sectional representation of an alternative LED of the present invention with a conducting substrate, wherein the substrate is made of a hole-injecting material.

FIG. 3 illustrates the use of a translucent, preferably transparent, substrate (31) having sufficient conductive characteristics to allow for the elimination of a separate electrode layer, e.g., the electrode layer (9) of FIG. 1. In the embodiment of FIG. 3, because the contact material (43) does not burrow through the polymer layer (33) to short to electrode (31), the hole-injecting material (31) of FIG. 3 can be directly underneath the contact material (43) that bonds wire (45) to the base electrode layer (35).

Preferably, the electroluminescent polymer layer is a poly(p-phenyleneacetylene) polymer (PPA) of the formula —[—C≡C—Ar—C≡C—Ar—]$_n$—, wherein Ar is an arylene group, preferably a substituted arylene group. It possesses a number average molecular weight of at least about 2,000, wherein $n \geq 5$. By "substituted" arylene (or phenylene), it is meant that the arylene group(s) in the main polymer chain contains at least one pendant functional group that does not interfere with the formation of the linear polymers. The term "arylene" also refers to an aromatic moiety such as phenylene, biphenylene, naphthylene, thiophenylene, and the like, which contains further pendant groups as noted above.

Preferably, the polymers have a number average molecular weight of no greater than about 100,000, and more preferably no greater than about 50,000. Most preferably, the polymers have a number average molecular weight of about 10,000–50,000. For the PPA polymers, preferably n=12–200, more preferably n=12–100, and most preferably n=12–80. For those polymers in which n is small, i.e., n=5 for example, the end groups of the molecules are terminal acetylenes.

Figure 4:
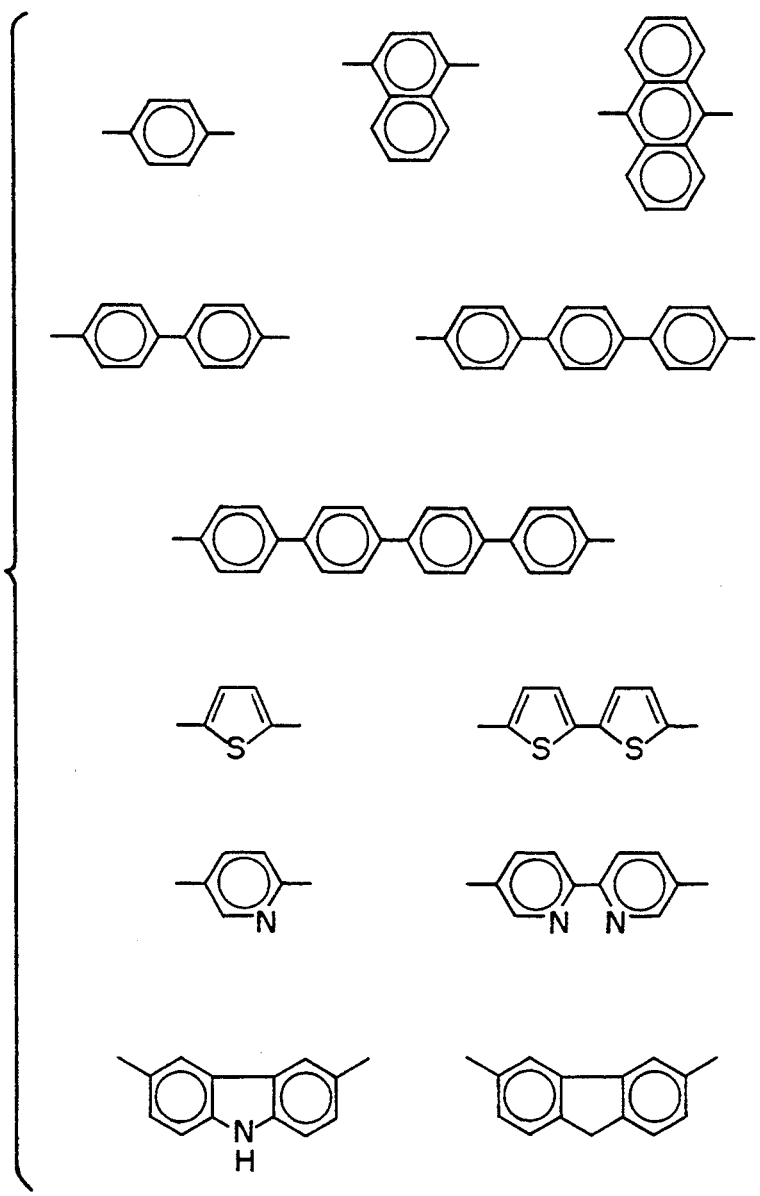
FIG. 4 is a list of possible representative arylenes, i.e., bis-functional aromatic moieties. These arylenes are also preferably functionalized with at least one pendant group (not represented).

Preferably the arylene group is a $(C_6-C_{24})$arylene. More preferably, the arylene is a $(C_6-C_{24})$arylene substituted with at least one functional group. This can include, for example, phenylene, fused ring systems such as naphthylene, multiple ring systems such as biphenylene, or hetero-aromatic systems such as a thiophenylene or pyridenylene group or mixtures thereof. Representative examples of arylenes, i.e., bis-functional aromatic moieties, are shown in FIG. 4 (without any pendant groups represented). More preferably, the $(C_6-C_{24})$arylene is a 1,4-phenylene, which is substituted with at least one functional, i.e., pendant, group for advantageous solubility in organic solvents.

A wide variety of functional groups, i.e., substituents, can be present on the arylene moieties, including $(C_1-C_{22})$alkyl, $(C_1-C_{22})$alkoxy, $(C_2-C_6)$alkenyl, $(C_6-C_{17})$aryl, F, Cl, amino, nitro, and the like. Preferably, the arylene (e.g., phenylene) moieties are functionalized with pendant groups, i-e., substituents, selected from the group consisting of $(C_1-C_{22})$alkyl, $(C_1-C_{22})$alkoxy, or mixtures thereof. More preferably, the pendant groups are selected from the group consisting of $(C_1-C_{10})$alkyl, $(C_1-C_{10})$alkoxy, or mixtures thereof. Most preferably, the pendant groups are $(C_1-C_{10})$alkoxy groups.

The substituted arylene is preferably mono-substituted or disubstituted, preferably it is disubstituted, i.e., contains two pendant groups. For a fused ring or multiple ring system, this does not necessarily mean that every ring in the system must be disubstituted, however. For optimum formation of linear polymers, these two pendant groups are in an ortho- or para- relationship. For example, preferred 1,4-phenylenes are 2,3-disubstituted-1,4-phenylene (ortho substituted), and 2,5-disubstituted-1,4-phenylene (para substituted).

The polymers of the present invention are generally soluble in organic solvents, e.g., hydrocarbon and ether solvents, such as toluene, chloroform, benzene, methylene chloride, tetrahydrofuran, and the like. The solubilities of the polymers are typically at least about 0.5 gram per liter, preferably at least about 4.0 grams per liter; however, this varies depending on the pendant groups and the solvents chosen.

The base electrode layer, i.e., the electron-injecting electrode layer, can be a layer of any metal or metals capable of injecting electrons into the polymer layer, i.e., any metal, metal alloy, or metalloid (B, Si, Ge, As, Sb, Te), in the Periodic Chart, or even a nonmetal(s) which can inject electrons into the polymer layer. Preferably, this material has a low work function, i.e., no greater than about 4.5 eV. Furthermore, this material has a work function that is at least about 0.5 eV, preferably at least about 1.0 eV, lower than the work function of the material used in the hole-injecting electrode. As used herein, "work function" is used in its conventional sense to mean the energy needed to remove an electron to infinity- More preferably, the base electrode layer is a layer of aluminum, yttrium, a lanthanide, an actinide, or an alkaline-earth metal. Most preferably, the base electrode layer is a layer of aluminum, at least because aluminum yields more stable devices.

The hole-injecting electrode layer can include a material capable of injecting holes (i.e., positive charges) into the electroluminescent polymer. This material can be, for example, a metal, mixed-metal, i.e., a metal alloy, an oxide of a metal or mixed-metal, or it can be a conducting polymer. To allow for the transmission of light through this layer, the material is at least translucent, and preferably transparent. Preferably, this hole-injecting electrode includes a mixed-metal oxide wherein the metals are those in Groups IIIA and IVA (Groups 13 and 14), such as indium-tin-oxide, or a conducting polymer, such as polyaniline. More preferably, the hole-injecting electrode is indium-tin-oxide, at least because it is a conducting material with a relatively low density of structural defects, and it is inherently stable (infinite lifetime).

As used herein, "metal" includes transition metals, i.e., those elements in the Periodic Table with their outermost electrons in "d" orbitals; lanthanides and actinides, i.e., those elements in the Periodic Table with their outermost electrons in "f" orbitals; the heavier elements of Group IIIA, i.e., Group 13 (Al, Ga, In, Tl); the heavier elements of Group IVA, i.e., Group 14 (Sn, Pb); the heavier elements of Group VA, i.e., Group 15 (Bi); all the elements of Group IA, i.e., Group 1, the alkali metals; and all the elements of Group IIA, i.e., Group 2, the alkaline earth metals. It is understood that alloys of these metals and oxides of these metals or mixtures of these metals, can be used for the electrodes in the diodes of the present invention.

The substrate can be any type of rigid or flexible substrate that is at least translucent, preferably transparent. It can be conducting or nonconducting. It can function as a support for a hole-injecting electrode layer or it can function as the hole-injecting electrode. Preferably, the material of which this substrate is made is glass, pyrex, quartz, polyimide, and the like. More preferably, the material is glass.

In preferred embodiments, the diode can be coated with a protective layer to impede diffusion of $O_2$ and $H_2O$ into the diode. This protective layer can be, for example, a metal, an epoxy, a polyvinyl chloride spray, an ionic compound, such as LiF, or any other ionic compound that can be deposited on the diode without heating the diode to temperatures that will degrade it. Preferably, the protective layer is a standard epoxy or an ionic compound like LiF.

The emission of the PPA-based LEDs of the present invention is yellow. Advantageously, the LEDs of the present invention can be operated at a temperature greater than about 75° C., and often at a temperature up to about 100° C. Additional advantages of the PPA-based LEDs are: (i) tunibility of the color by controlling the molecular weight; (ii) the ability to anneal them and consequently modify the metal-polymer interface to obtain a more stable and uniform LED; (iii) the ability to blend them with related polymers to achieve color control from blue-to-red; and perhaps most importantly, (iv) the failure rate of these devices due to shorts is reduced to almost zero following their annealing.

Synthesis of the LEDs

The LEDs of the present invention are fabricated by coating a layer of a conjugated polymer, preferably an acetylene-based polymer, such as a PPA polymer, onto an hole-injecting electrode, preferably onto an indium-tin-oxide-coated (ITO) substrate. A layer of base electron-injecting electrode, preferably aluminum, is then evaporated onto the polymer layer. Wires, e.g., copper wires, are then bonded to the Al and ITO layers. Generally, this is done with silver paint or epoxy.

The polymer can be coated using any number of techniques known to one of skill in the art that can produce very uniform coating thicknesses. This includes, for example, spin-coating, and Langmuir-Blodgett-type coating. Each of these methods is capable of producing a polymer layer that is substantially uniform in thickness, i.e., ±3%, and substantially uniform in morphology and structural integrity. Preferably, the polymer layer is produced using a spin-coating technique. It is understood, however, that prepolymers can also be deposited on the hole-injecting electrode with subsequent polymerization after deposition.

The material that forms the base electrode layer can be deposited using any of the evaporative techniques that are known to one skill in the art. This includes, for example, thermal evaporation, e-beam evaporation, and sputtering. Preferably, e-beam evaporation is used.

After the diode is prepared, i.e., after the three layers are formed, it is then annealed, i.e., baked, at a temperature effective to maximize the operating lifetime of the diode as an efficient electroluminescent (EL) device. Typically, the annealing is carried out at a temperature and for a period of time to reduce the EL threshold voltage by at least about 20%, preferably at least about 30%. Alternatively, the annealing is carried out at a temperature and for a period of time to show improvement in the catastrophic failure rate of the prepared diodes by at least about 2%, preferably at least about 10%.

Preferably, the diode is annealed at a temperature of about 100°-250° C., more preferably at a temperature of about 120°-200° C., and most preferably at a temperature of about 150°-200° C. Preferably, the diode is annealed for about 1-24 hours, preferably for about 1-10 hours, and more preferably for about 2-4 hours. Preferably, this annealing process is carried out under a substantially oxygen-free environment, such as under a nitrogen or argon atmosphere.

Following the annealing treatment of the diodes of the present invention, the EL becomes much more homogeneous, i.e., the emission from the polymer is much more uniform. Whereas if the initial active area, i.e., the area of the polymer that emits visible light, of the diode is typically about 20%, it usually increases to about 80% after annealing. In addition, the usual pinhole resistive shorts present in the pristine diodes are passivated during the annealing process. The EL threshold voltage also typically decreases by at least about 20%, preferably by at least about 30%, and often greater, following the annealing procedure. The actual value of the threshold voltage is roughly proportional to the emissive polymer layer thickness, and varies from about 3 volts at a film thickness of several hundred angstroms to about 50 volts for a layer that is several thousand angstroms thick. Concomitant with this change is an increase in the EL efficiency as measured by the ratio of the output EL power to the electrical input power, to about $3 \times 10^{-6}$ at an injection current of about 100 $\mu$A. As a comparison, the efficiency of commercial GaAs-based LEDs typically increases from $10^{-4}$ at 250 $\mu$A to about $6 \times 10^{-4}$ at 20 mA.

The PPA-based diodes can be operated at injected currents up to about 10 mA yielding an intensity of about $5 \times 10^{-4}$ mW, and appear brighter than the low-current GaAs-based LEDs. Operation at the high intensity can be continued for at least one second without any apparent degradation of the LED. It therefore implies that the foregoing procedure can be used to fabricate a matrix of polymer-based LED pixels which would be stable under operation in a pulsed mode.

Although the inventors do not wish to be held to any theory, it is believed that the annealing procedure improves the metal-polymer contact. One potential source for this improvement may be the formation of metal-polymer bonds which do not break the bond conjugation of the polymer. This possibility is essentially unique to acetylene-based diodes, since these are the only conjugated polymer-based diodes in which the conjugation is created by triple $C \equiv C$ bonds. In all other conjugated polymers, bonding to a metal, oxygen, hydrogen, etc., will reduce the double $C = C$ bond to a single bond and eliminate the conjugation. In acetylene-based polymer, bonding to that atom will only reduce the triple $C \equiv C$ bonds to double $C = C$ bonds, thus retaining the conjugation. This unique feature of the acetylene-based diodes may also offer another similar advantage over all other conjugated polymer-based LEDs. Whereas crosslinking inevitably eliminates the $\pi$-conjugation of polymers with double $C = C$ bonds, it would not necessarily eliminate that of acetylene-based polymers. Therefore, annealing processes which induce crosslinking and consequent defects in the $\pi$ conjugation of other polymers, may actually remove defects from PPA films without elimination of the $\pi$ conjugation.

To impede diffusion of $O_2$ and $H_2O$ into the diode, it may be coated with a protective layer. This is typically done using evaporative techniques. However, even if no steps are made to protect the diodes from $O_2$ and $H_2O$ in the ambient air, the diodes of the present invention typically are operable continuously for up to about 18 hours at a bias voltage of about 10 volts and injected current of about 0.5 mA.

In addition, the stability of the diodes can be improved by preferably carrying out the steps of the present method in a substantially oxygen-free environment, such as a nitrogen or argon atmosphere. Generally, the diodes of the present invention can be prepared in a protective enclosure, e.g., a glove box, having a substantially oxygen-free environment. Alternatively, at least some steps, such as the annealing step, can be carried out under a stream of nitrogen or argon gas, preferably dry nitrogen or argon gas, for example.

The following examples are offered to further illustrate the various specific and preferred embodiments and techniques. It should be understood, however, that many variations and modifications may be made while remaining within the scope of the present invention.

EXPERIMENTAL EXAMPLES

Example 1: Fabrication of an Al/PPA/ITO LED

The glass/ITO substrate must contain a high-quality ITO layer, free of pinhole-size defects which can be observed with an optical microscope, i.e., it must not contain pinholes which are much greater than about 1 $\mu$m. The indium-tin-oxide coated glass used herein was Baltracan Z-20 ITO available from Balzers Corp., Fremont, Calif.

The substrates used for diode fabrication were first cut from a large sheet of ITO-covered glass, to roughly $4 \times 8$ mm$^2$ rectangles. Care was taken while cutting the sheet, to avoid scratching the ITO or introducing other defects. This was accomplished by placing the sheet (ITO face down) on a soft issue and scribing the bare glass (upper) side with either a diamond scribe or glass-cutting wheel. The glass/ITO substrate rectangles were then thoroughly cleaned prior to spin coating of the emissive polymer layer. First some (about 30%) of the ITO was etched off of the glass substrate to provide a subsequent area for wire bonding to the top Al electrode without shorting through the polymer to the ITO. The etching of the ITO off of the glass substrate was accomplished by applying a droplet of a solution of 45% water, 45% HCl, and 10% HNO$_3$ to the ITO. After removing this portion of the ITO, the typical cleaning procedure involved soaking in hot (about 60° C.) alkaline laboratory soap cleaner for about 30 minutes, and then rinsing with deionized water. This was followed by either an acetone rinse while spinning the substrate or a second rinse with deionized water and drying by a dry N$_2$ gas while spinning the substrate.

The solution of a PPA polymer in toluene was first filtered through a micropore filter to minimize the density of all submicron (i.e., $\geq 0.5$ μm) and larger particles, whether foreign, recrystallized, or cross-linked clusters of the polymer, in the solution. Spin coating of the polymer solution onto the glass/ITO substrate was then carried out using a Desk Top Spin Coater Model P6204 equipped with a 2.75 inch type CS vacuum chuck (available from Specialty Spin Coating Systems, Indianapolis, Ind.). The ITO/glass substrate was placed on the spinner and the upper surface was wetted with the polymer solution. The substrate was then immediately spun at about 4000 rpm for 5–10 seconds.

The glass/ITO/polymer structure was then introduced into an e-beam evaporation chamber for the deposition of the top metal layer electrode. The structures were placed on top of a mask that enables the deposition of the Al layer on a central portion (30–50%) of the top polymer surface only. The chamber was pumped for a period of at least 3 hours, so that the background pressure was reduced below $8 \times 10^{-6}$ tort. An Al ingot placed in the crucible was then evaporated by the e-beam, and its vapors were deposited on the emissive polymer layer to form an Al layer about 1000 Å thick. The diodes were then cooled in the evaporation chamber for about 20 minutes.

After removal of the diodes from the evaporation chamber, they were placed (metal on top) on a hot plate and flushed with dry $N_2$ gas. The temperature of the hot plate was slowly raised to a temperature of 150° C. at a rate of about 4° C./minute. The diodes were then annealed at this temperature for 2–4 hours, after which the power to the hot plate was turned off and slowly cooled back to room temperature at a rate of about 2° C./minute.

In preparation for wire bonding, 44 gauge uninsulated Cu wire was cut to lengths of 1–2 inches. Then a delicate toothpick was dipped in a well-mixed conductive silver paint. A tiny droplet of the paint was then applied to the region of the top Al layer that is directly above the portion of the glass from which the ITO was etched off. This procedure ensures that shorting of the Al to the ITO by the pressure applied to the Al or by diffusion of the silver paint will be avoided. One end of the Cu wire was then dipped in the silver paint and applied to the droplet already deposited on the Al electrode. The paint was then allowed to dry for about one minute before bonding the other wire.

A similar procedure was followed for bonding the other wire to the ITO. A toothpick was dipped in the silver paint and rubbed on a portion of the exposed polymer layer, i.e., a region not covered by the Al metal layer. This droplet migrates through the polymer layer to come into contact with the underlying electrode surface. The second Cu wire of same gauge and similar length was then dipped in the silver paint and applied to this droplet. The two silver paint wire bonds were then allowed to dry for about 10 minutes.

To operate the diode, the ITO contact was positively biased with respect to the Al metal contact layer.

Example 2: Characterization of Various PPA-Based LEDs

Various diodes were made in an analogous manner to that described in Example 1, with and without the annealing step. The polymers used were either a 2,5-dibutoxy or a 2,5-dihexoxy derivative of PPA. The base electron-injecting electrode material was either Al or Ca, and in some examples it was a layer of Ca protected by a layer of Al. The hole electrode material was ITO coated onto a glass substrate, as used in Example 1.

Figure 5:
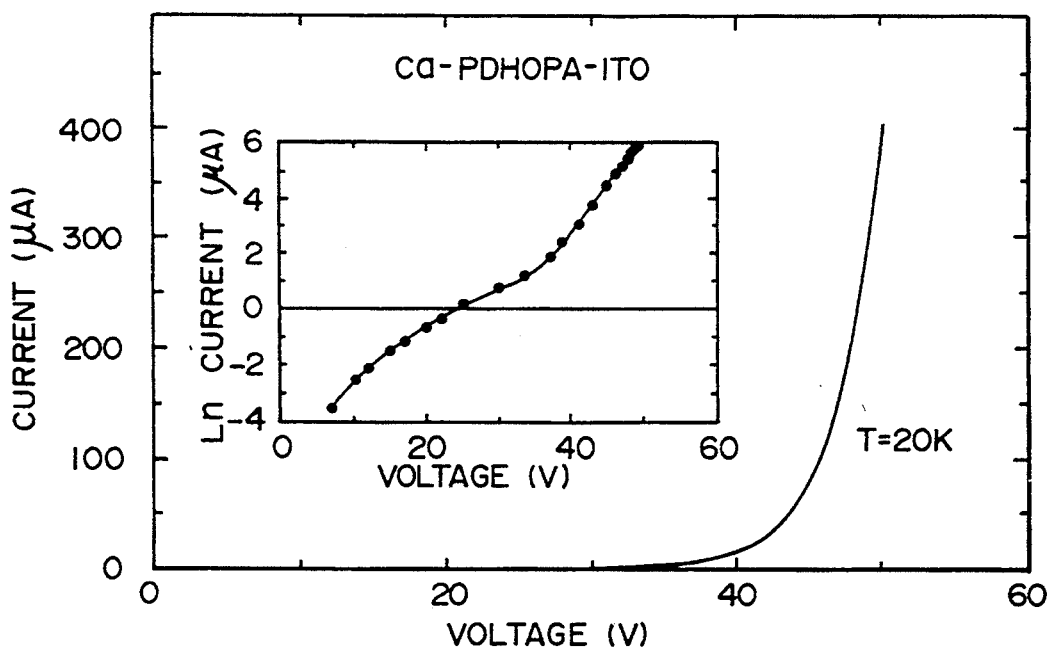
FIG. 5 is a graph of current vs. voltage (I-V) of an LED containing a layer of a dihexoxy derivative of PPA and a Ca electrode, with an Al protective layer, measured at 20K. The same plot on a semilogarithmic scale is shown in the inset.

The current-voltage (I-V) curve of an LED containing a relatively thick layer, i.e., believed to be about 5,000 Å, of the dihexoxy derivative of PPA having a number average molecular weight of 10,000, and a Ca/Al electrode, measured at 20K, is shown in FIG. 5. As expected, the I-V curve is highly nonohmic but reveals an unusual nonlinear behavior when plotted on a semilogarithmic scale (inset of FIG. 5). It should be noted that the threshold voltage $V_f$ for current injection, which was a very high about 40 V, was due to the large thickness of the polymer layer. $V_f$ increased by about 30% upon cooling to 20K in all cases, except that of diodes fabricated from the dihexoxy derivative and baked for about 4 hours at 150° C. In the latter case, $V_f$ increased from about 10 V at room temperature to about 40 V at 20K. $V_f$ of other LEDs containing a much thinner polymer layer, i.e., as low as 500 Å, was as low as about 4 V.

Figure 6:
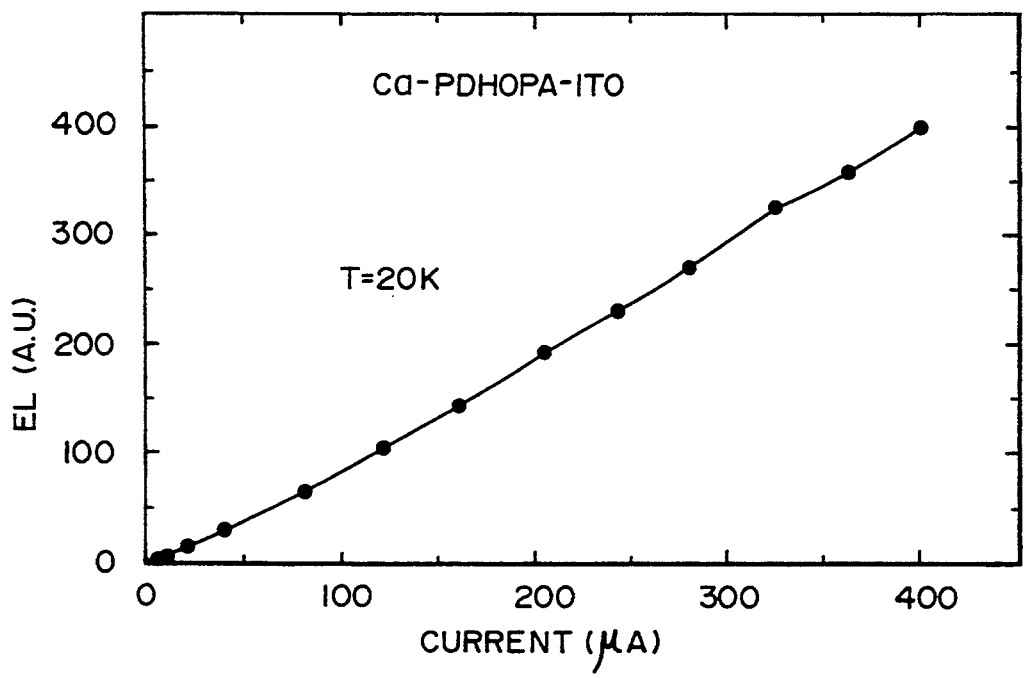
FIG. 6 is a graph of the total electroluminescence (EL) intensity vs. injected current for an LED containing a layer of a dihexoxy derivative of PPA and a Ca electrode, with an Al protective layer, measured at 20K.

The dependence of the total EL intensity on injected current for the same diode used to produce the data shown in FIG. 5 is plotted in FIG. 6. Although the intensity appears to be directly proportional to I, its behavior is slightly nonlinear, with a slope that increases with I, at low values of the injected current. It should be noted that while the photon/electron yield of the diodes fabricated with an Al layer was only $2 \times 10^{-3}$, the yield of the diodes containing a Ca/Al layer was in the 0.1–0.5% range. Some of the diodes were tested at injected currents up to about 10 mA, yielding an intensity of $5 \times 10^{-4}$ mW, and appeared brighter than typical commercial GaAs-based LEDs. Operation at this intensity could be continued for at least one second without any apparent degradation of the LED. It should also be emphasized that all of the LEDs exhibited stable behavior, with no detectable degradation, when operated at low temperatures.

Figure 7:
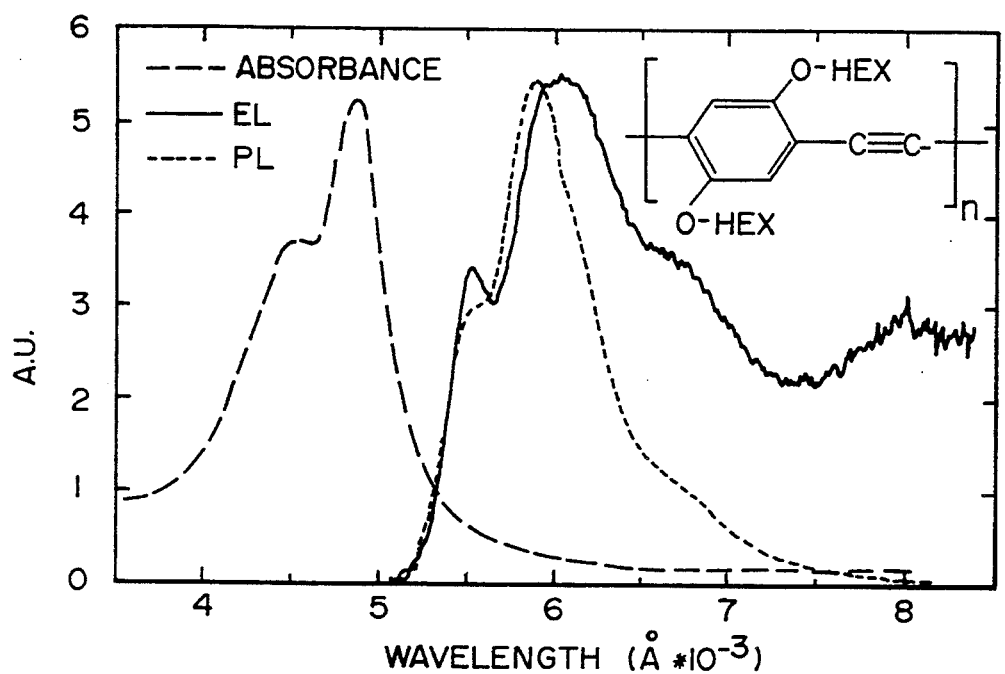
FIG. 7 is a chart of the absorbance, photoluminescence (PL), and electroluminescence (EL) emission spectra of a typical LED containing a layer of a dihexoxy derivative of PPA and a Ca electrode, with an Al protective layer, measured at 20K.
Figure 8:
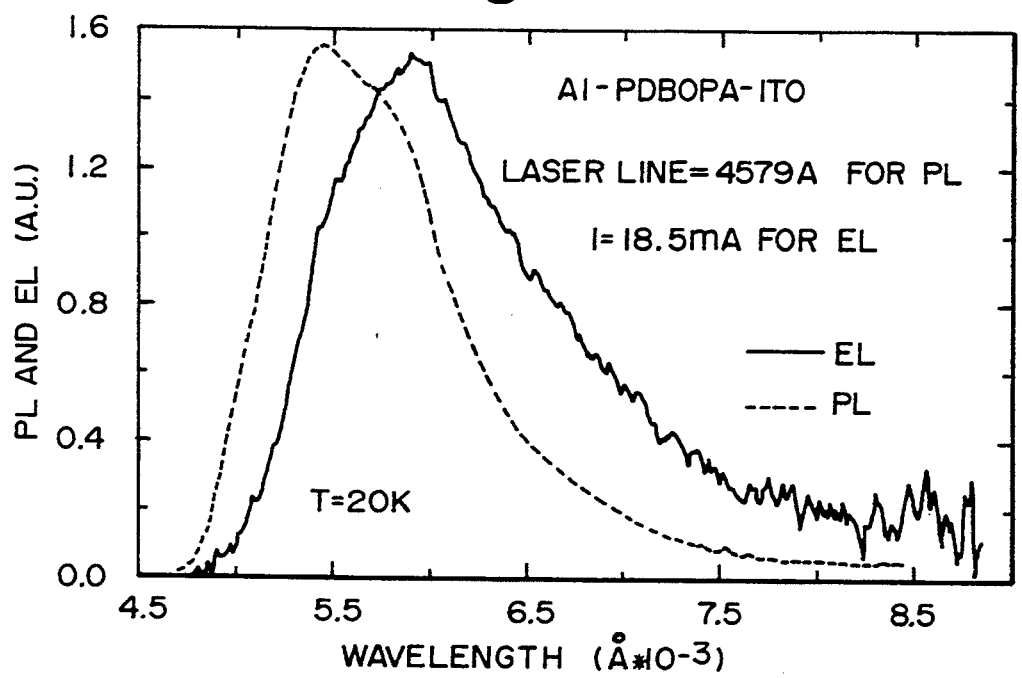
FIG. 8 is a chart of the electroluminescence (EL) and photoluminescence (PL) spectra of a diode fabricated from a dibutoxy derivative of PPA and an Al electrode, measured at 20K.

The absorption, PL, and EL emission spectra of a typical LED containing the 2,5-dihexoxy derivative of PPA and a Ca/Al layer is shown in FIG. 7. This diode was the same as that used for the data produced in FIGS. 5 and 6. The EL and PL spectra of a diode fabricated from the 2,5-dibutoxy derivative of PPA and an Al layer are shown in FIG. 8. This 2,5-dibutoxy PPA polymer had a number average molecular weight of 2,900, and was deposited in layer having a thickness believed to be about 2,500 Å.

With respect to FIGS. 7 and 8, several observations are noteworthy. The phonon sidebands of the emission spectra of the PPA-based diodes are broad and only weakly resolved. The EL spectra of the PPA-based LEDs are clearly red-shifted with respect to the PL spectra, with an overall emission in the yellow region of the visible spectrum. While the only difference between the EL and PL of the ITO/(dibutoxy-PPA)/Ca diodes is the red-shift of the former with respect to the latter, the EL emission of the ITO/(dihexoxy-PPA)/Ca diodes also displays a broad structureless band at about 1.5 eV (8000 Å).

Significant improvement in the performance of the ITO/(dibutoxy-PPA)/Al and ITO/(dihexoxy-PPA)/Al diodes was observed following annealing for 2–6 hours at about 150° C. For example, the emission became much more homogeneous. Whereas the initial active area was typically about 20%, it increased to about 80% following annealing. Failure due to "pinhole"-type sparks which short the diode and were common in the pristine diodes were all but eliminated by the annealing process. Indeed, some of the diodes were operable continuously for about 18 hours at a bias voltage of about 10 V and injected current of about 0.5 MA, despite exposure to air without a heat-sink. The EL threshold voltage typically decreased by about 30% following annealing. As mentioned above, the actual value is roughly proportional to the emissive polymer layer thickness, and varies from about 4 V at a film thickness of believed to be 700–800 Å to about 50 V for a layer that is several thousand angstroms thick. Some of the annealed LEDs were also tested at elevated temperatures. Indeed, they were operable at temperatures in excess of 75° C. in most cases and up to 100° C. in some of the diodes. However, they failed catastrophically above 100° C. due to shorts.

Example 3: Synthesis of the PPA Monomers

Preferred PPA monomers were synthesized via a Pd-catalyzed coupling reaction between 1,4 dialkoxy-2,5-diethynylbenzene and 1,4-diiodo-2,5-dialkoxybenzene. The synthesis of 1,4-diiodo-2,5-dialkoxybenzene involves the use of benzyltrimethylammonium dichloroiodate (BTMAICl$_2$, which is commercially available or can be synthesized by the method described in S. Kajigaeshi et al., Chem. Lett., 2109 (1987)) as the iodination reagent by a method described in S. Kajigaeshi et al., Chem. Lett., 795 (1988). The diiodo compounds not only meet the polymer structure need but can also be easily synthesized in reasonable yields as described in the Scheme 1. The compounds formed by this method, along with characterizing data is set out in Table 1.

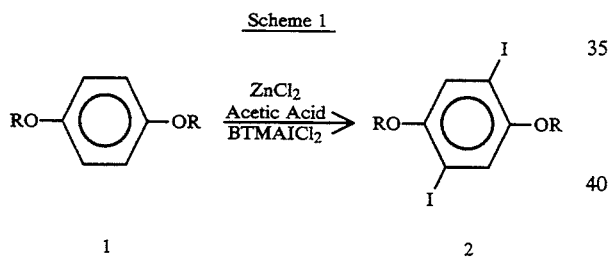

1        2

TABLE 1

Summary of Diiodo Compounds

| No | Monomers | Yield % | MP (°C.) | Exact m/z | Reaction Times |
|----|----------|---------|----------|-----------|----------------|
| 1 | R = C$_4$H$_9$ | 52% | 86–88 | 473.95528 cal<br>473.95588 exp | 24 hrs |
| 2 | R = C$_5$H$_{11}$ | 55% | 73–75 | 501.98658 cal<br>501.98656 exp | 12 hrs |
| 3 | R = C$_6$H$_{13}$ | 57% | 58–59 | 530.01788 cal<br>530.01708 exp | 12 hrs |
| 4 | R = C$_8$H$_{17}$ | 69% | 56–57 | 586.08048 cal<br>586.08012 exp | 24 hrs |
| 5 | R = C$_{10}$H$_{21}$ | 45% | 59–61 | 642.14309 cal<br>642.14350 exp | 48 hrs |

MP = Melting point
m/z = Exact mass by High Resolution Mass Spectroscopy

The synthesis of the diacetyl monomers is described in Scheme 2. 1,4-Dialkoxybenzenes can be synthesized by the method described in M. E. Neubert et al., Mol. Cryst. Liq. Cryst., 44, 197 (1978). The Pd-coupling reaction was performed under argon atmosphere at room temperature with good yield. The desilylation was carried out in methanol containing a catalytic amount of potassium hydroxide under argon atmosphere at room temperature. These monomers were characterized by routine methods.

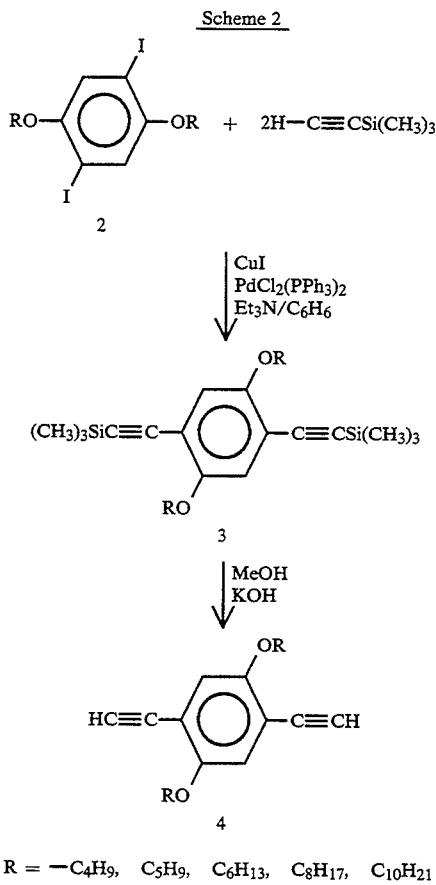

R = —C$_4$H$_9$, C$_5$H$_9$, C$_6$H$_{13}$, C$_8$H$_{17}$, C$_{10}$H$_{21}$

Example 4: Polymerization of the PPA Polymers

The synthesis of the monomer 3 (Scheme 2) by palladium-coupling reaction indicated that the coupling reaction between diiodo compounds and ethynyl compounds can be performed at room temperature in a few hours with excellent yields. Thus, the polymerization described in Scheme 3 was carried out in the mixture of toluene and triethylamine at 25°–60° C. under argon atmosphere. The catalysts were PdCl$_2$(PPh$_3$)$_2$ and CuI in about 1:1 ratio. Polymerization was achieved within 24–48 hours. The polymers were purified by precipitation twice in excess methanol, resulting in yields of 70–90%. Since these PPA polymers are soluble in THF, toluene, and CDCl$_3$ after purification, they can be processed into films or fibers.

These PPA polymers have been well characterized by NMR, FTIR, GPC and elemental analysis. Part of the data is shown in Table 2. The molecular weights of the PPA polymers were measured by GPC and viscometer in THF solution at room temperature. Polystyrene was used as the standards. The number-average molecular weights (Mns) ranged from $2.9 \times 10^3$ to $22 \times 10^3$, depending on the polymer side groups, indicating an average length of 12–53 repeat units (DP). The polydispersities were about 2.4–5.1.

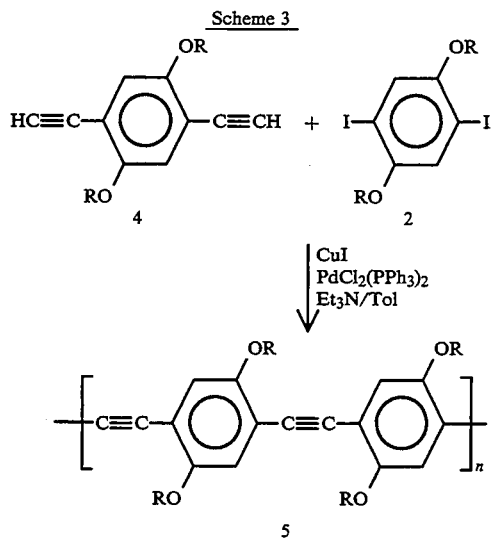

Scheme 3

TABLE 2
Summary of PPA-Polymers

| No. | Polymers | Yield % | Mn | PD | DP | Vis | Reaction Times |
|---|---|---|---|---|---|---|---|
| 1 | PPA-4 | 86% | $2.9 \times 10^3$ | 4.2 | 12 | 0.09 | 12 hrs |
| 2 | PPA-5 | 94% | $6.7 \times 10^3$ | 4.5 | 25 | 0.40 | 16 hrs |
| 3 | PPA-6 | 95% | $10 \times 10^3$ | 2.4 | 30 | 0.30 | 16 hrs |
| 4 | PPA-8 | 94% | $12.4 \times 10^3$ | 3.7 | 35 | 0.49 | 24 hrs |
| 5 | PPA-10 | 93% | $22 \times 10^3$ | 3.1 | 53 | 1.32 | 24 hrs |

PD = Polydispersity
DP = The Degree of Polymerization
Vis = Intrinsic Viscosity
PPA-4 = PPA derivative with dibutoxy side chain
Mn = Number average molecular weight All patents, patent documents and publications cited hereinabove are incorporated by reference. The foregoing detailed description has been given for clarity of understanding only and no unnecessary limitations are to be understood therefrom. The invention is not limited to the exact details shown and described, for obvious modifications will occur to those skilled in the art.

What is claimed:

1. A method for producing a polymer-based light-emitting diode comprising the steps of:
   (a) providing a hole-injecting electrode;
   (b) coating the hole-injecting electrode with a layer of a conjugated polymer to form a conjugated polymer-coated hole-injecting electrode;
   (c) coating the conjugated polymer-coated hole-injecting electrode with a layer of an electron-injecting material to form an electron-injecting electrode; wherein the hole-injecting electrode, polymer layer, and electron-injecting electrode form a polymer-based light-emitting diode (LED); and
   (d) annealing the polymer-based LED at a temperature and for a period of time effective to reduce the electroluminescence threshold voltage by at least about 20%.

2. The method of claim 1 wherein the step of annealing is carried out for about 1–24 hours at a temperature of about 100°–250° C.

3. The method of claim 2 wherein the step of annealing is carried out for about 2–4 hours.

4. The method of claim 1 wherein the step of annealing is carried out in a substantially oxygen-free environment.

5. The method of claim 2 wherein the step of annealing is carried out at a temperature of about 120°–200° C.

6. The method of claim 1 wherein the step of coating the polymer comprises spin-coating the hole-injecting electrode.

7. A method for producing a polymer-based light-emitting diode comprising the steps of:
   (a) providing a hole-injecting electrode;
   (b) coating the hole-injecting electrode with a conjugated polymer to form a conjugated polymer-coated hole-injecting electrode, wherein the conjugated polymer is a soluble poly(p-phenyleneacetylene) polymer of the formula —[—C≡C—Ar—C≡C—Ar—]n—, having a number average molecular weight of at least about 2,000, wherein Ar is an arylene group and n≧5;
   (c) coating the conjugated polymer-coated hole-injecting electrode with a layer of an electron-injecting material to form an electron-injecting electrode; wherein the hole-injecting electrode, polymer layer, and electron-injecting electrode form a polymer-based light-emitting diode (LED); and
   (d) annealing the polymer-based LED at a temperature and for a period of time effective to reduce the catastrophic failure rate by at least about 2%.

8. The method of claim 7 wherein the step of annealing is carried out at a temperature of about 100°–250° C.

9. The method of claim 8 wherein the step of annealing is carried out for about 1–24 hours.

10. The method of claim 1 wherein each step is carried out in a substantially oxygen-free environment.

11. The method of claim 10 wherein the step of annealing is carried out at a temperature of about 120°–200° C.

12. The method of claim 7 wherein the step of coating the polymer comprises spin-coating the electron-injecting electrode.

13. The method of claim 7 wherein the step of coating the electron-injecting material comprises evaporating the material in an e-beam evaporation chamber.

14. The method of claim 7 wherein the step of coating the electron-injecting material comprises thermally evaporating the material.

15. The method of claim 1 wherein the annealing step is carried out in a substantially oxygen-free environment.

16. A method for producing a polymer-based light-emitting-diode comprising the steps of:
   (a) providing an indium-tin-oxide-coated (ITO) glass substrate having a first and second surface, wherein the first surface has the ITO coated thereon;
   (b) removing an amount of the ITO from the first surface to expose a portion of the glass substrate;
   (c) filtering an organic solvent solution of a poly(p-phenyleneacetylene) polymer of the formula —[—C≡C—Ar—C≡C—Ar—]n—, having a number average molecular weight of at least about 2,000, wherein Ar is an arylene group and n≧5;
   (d) spin-coating the solution of a poly(p-phenyleneacetylene) polymer onto the ITO glass substrate first surface having a portion of the glass substrate exposed by wetting the ITO glass substrate with the polymer solution while spinning the ITO glass substrate to form a polymer-coated ITO glass substrate;

(e) evaporating a layer of aluminum onto the polymer-coated ITO glass substrate to form an electron-injecting electrode; wherein the hole-injecting electrode, polymer layer, and electron-injecting electrode form a polymer-based light-emitting diode (LED); and (f) annealing the LED.

17. The method of claim 16 wherein the step of evaporating a layer of aluminum comprises depositing a layer of aluminum on a central portion of the polymer-coated ITO glass substrate wherein about 30–50% of the area of the surface of the substrate is coated with the layer of aluminum.

18. The method of claim 15 wherein the step of annealing is carried out for about 1–24 hours at a temperature of about 100°–250° C.

19. A polymer-based light-emitting diode made by the process of claim 1.

20. The polymer-based light-emitting diode of claim 19 wherein the conjugated polymer is an acetylene-based polymer.

* * * * *